United States Patent
Jung

(10) Patent No.: US 7,041,573 B2
(45) Date of Patent: May 9, 2006

(54) METHOD FOR FABRICATING SEMICONDUCTOR DEVICE HAVING TRENCH ISOLATION

(75) Inventor: Tae-Woo Jung, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/880,019

(22) Filed: Jun. 29, 2004

(65) Prior Publication Data
US 2005/0250293 A1    Nov. 10, 2005

(30) Foreign Application Priority Data
May 10, 2004   (KR) ..................... 10-2004-0032773

(51) Int. Cl.
*H01L 21/76* (2006.01)
(52) U.S. Cl. ..................... 438/424; 438/445; 257/301
(58) Field of Classification Search ..................... None
See application file for complete search history.

(56) References Cited

U.S. PATENT DOCUMENTS 6,037,238 A * 3/2000 Chang et al. ............... 438/426
6,255,176 B1 * 7/2001 Kim et al. ................... 438/296
6,391,793 B1 * 5/2002 Lee et al. ..................... 438/745
6,784,077 B1 * 8/2004 Lin et al. ..................... 438/426

* cited by examiner

*Primary Examiner*—Dung A. Le
(74) *Attorney, Agent, or Firm*—Blakely Sokoloff Taylor & Zafman

(57) ABSTRACT

Disclosed is a method for fabricating a semiconductor device capable of preventing a depth of a plurality of moats M from getting deeper as preventing lowering a threshold voltage by forming a round shape of a top corner of a trench. Particularly, the method includes the steps of: forming a pad pattern by sequentially stacking a pad oxide layer and a pad nitride layer on a substrate; forming a trench by etching process to an exposed surface of the substrate by using the pad pattern as a mask; filling an insulation layer for isolating device elements filled into the trench; removing the pad nitride layer; performing a pre-cleaning process for removing the pad oxide layer; selectively recessing the surface of the substrate to remove a plurality of moats M taken place after removing the pad oxide layer; and forming a screen oxide layer on the surface of the substrate.

15 Claims, 6 Drawing Sheets

METHOD FOR FABRICATING SEMICONDUCTOR DEVICE HAVING TRENCH ISOLATION

FIELD OF THE INVENTION

The present invention relates to a method for fabricating a semiconductor device; and more particularly to a method for isolating device elements.

DESCRIPTION OF RELATED ARTS

In general, isolation (ISO) process of device elements has been proceeded by a typical method for isolating device elements such as a local oxidation of silicon (LOCOS) and a profiled grove isolation (PGI). Through the above methods, a field insulation layer is formed on a predetermined portion of a substrate, so that a field region limiting a reacted region is formed.

The LOCOS method for isolating device elements forms a nitride layer which is an oxide masks limiting the reacted region on the substrate. Then, the nitride layer is subjected to a patterning through a photolithography method, thereby exposing a predetermined portion of the substrate. Thereafter, the exposed substrate is oxidized and then the field oxide layer used as a device elements isolation region is formed.

There are advantages of the LOCOS method. The LOCOS method uses a very simple process and isolates both large and small areas simultaneously. However, an effective surface of source/drain region is decreased due to a bird's beak caused by a side oxidation, which expands a width of a device isolation region. In addition, while forming the field oxide layer, a cohesive power is concentrated on an edge of an oxide layer due to a difference of a coefficient of heat expansion. Therefore, a critical defect is taken place on the silicon substrate causing a serious problem of leaking an electric current.

Recently, as a degree of integration of a semiconductor device has been increased, a design rule has been decreased. Accordingly, a size of the semiconductor device and a size of a device isolation layer isolating device elements also have been decreased as much scale as the design rule has been decreased. Therefore, the typical method of isolating device elements such as the LOCOS and the PGI reaches a limitation to be applied.

In order to solve the above problems, a shallow trench isolation (STI) method is introduced. A nitride layer having a good substrate and a good etch selective ratio is formed on the substrate. Then, the nitride layer is subjected to the patterning through the photolithography method to be used as a hard mask. Next, the substrate is subjected to a dry etching process by a predetermined depth with use of the nitride layer pattern as the hard mask. Then, a trench is formed on the substrate. Afterwards, an insulation layer is filled into the trench and then, a field insulation layer filled in the trench is formed through a chemical mechanical polishing (CMP) process.

FIGS. 1A to 1D are cross-section views illustrating a method for isolating device elements with use of a conventional STI.

Referring to FIG. 1A, a pad oxide layer 12 and a pad nitride layer 13 are formed on the substrate 11. Then, a mask (not shown) for isolating device elements is formed on the pad nitride layer 13.

Next, the pad nitride layer 13 is etched back with use of the mask (not shown) for isolating device elements as an etch mask and the mask (not shown) for isolating device elements is removed, thereafter. Then, the pad oxide layer is etched back with use of the pad nitride layer 13 as the etch mask, thereby exposing a surface of the substrate 11. A formation of the trench 14 is formed by etching back the exposed substrate 11 in a predetermined depth.

Next, a wall oxide layer 15 is formed through a wall oxidation process on sidewalls and a bottom.

Next, a liner nitride layer 16 and a gap-fill insulation layer 17 are sequentially deposited in the wall oxide layer 15 and the trench 14. Afterwards, the gap-fill insulation layer 17 is applied to a chemical mechanical polishing (CMP) process until a surface of the pad nitride layer is exposed. At this time, a portion of the liner nitride layer 16 above the pad nitride layer 13 is also polished.

Referring to FIG. 1B, the pad nitride layer 13 is removed with use of a phosphoric acid ($H_3PO_4$) solution. At this time, the liner nitride layer 16 which is a nitride-based layer is partially removed.

Referring to FIG. 1C, the pad oxide layer 12 is removed through a pre-cleaning process. Then, a screen oxide layer for implanting ions to control a threshold voltage control is formed. While this pre-cleaning process is applied, a plurality of moats M which is lower than the reacted region are taken place on top corners (TC) of the trench 14. The plurality of moats M are taken place because a part of the wall oxidation layer is damaged while the pre-cleaning process for removing the pad oxide layer 12. A depth of the plurality of moats M gets much deeper passing through a subsequent a screen oxide layer formation process performed before a formation of gate electrodes, a pre-cleaning process and a gate oxide layer formation process performed before the gate oxide layer formation.

Referring to FIG. 1D, a screen oxide layer 18 is formed by oxidizing the substrate exposed after the pad oxide layer 12. However, although the screen oxide layer 18 is formed, the plurality of moats M are not removed. Then, during the pre-cleaning process before the formation of the gate oxide layer for removing the screen oxide layer, the plurality of moats M get much deeper.

Table 1 shows a depth of the plurality of moats based on each step of the process of the conventional method.

TABLE 1

| ISO Etch | Trench Top Corner | 90° | 90° |
|---|---|---|---|
|  | $CF_4/O_2$ | No | Yes |
|  | $O_2/N_2$ | Yes | No |
| Wall Oxidation | Pre-Cleaning | 30" | 30" |
|  | Layer Thickness | 80 Å | 80 Å |
| Screen Oxidation | Pre-Cleaning | 50:1 HF | 50:1 HF |
|  | Layer Thickness | 50 Å | 50 Å |
| Gate oxidation | Pre-Cleaning | HF 50" | HF 50" |
|  | Layer Thickness | 100 Å | 100 Å |
| Moat | Depth | 102 Å | 133 Å |

According to Table 1, 'ISO Etch' means a pad nitride layer etching process and a trench etching process. 'LET', i.e., light etch treatment and '$O_2/N_2$', means an etching process additionally etching back the trench.

During the trench etching process, an angle of the top corner (TC) should be 90° and then, the above etching process is performed. During the gate oxidation process, the pre-cleaning process is proceeded for 50 seconds with use of a hydrogen fluoride (HF), resulting in a formation of the gate oxide layer with a thickness of 100 Å.

During a screen oxidation process, the pre-cleaning process is proceeded for 130 seconds with use of the HF solution diluted in a ratio of 50 parts of water to 1 part of the HF and a screen oxide layer is formed with thickness of 50 Å. In this case, the depth of the plurality of moats M is 102 Å which is very deep. That is, after the screen oxidation pre-cleaning process, the wall oxide layer is located under the reacted regions. And according to the conventional method, the depth of the plurality of moats M after the screen oxidation formation is measured from approximately 100 Å to approximately 160 Å.

However, the conventional method shows some problems.

First, a shape of the top corner (TC) of the trench 14 after the dry etching process for forming the trench 14 is very steep; thereby lowering the threshold voltage of a transistor as voltages is relatively concentrated in the top corners (TC) of the trench 14.

Secondly, if the shape of the top corners (TC) of the trench 14 is very steep, it is not avoidable forming the plurality of moats M. Also, due to the plurality of moats M, a undesirable polysilicon layer is still remained on the plurality of moats M after performing the dry etching process and depositing the polysilicon layer for forming the subsequent gate electrodes, thereby, causing bridge formation between the adjoined gate electrodes.

Thirdly, in accordance with the conventional method, it is difficult to control the depth of the plurality of moats M less than 100 Å due to a limitation of a subsequent wet cleaning process similar to the pre-cleaning process performed after the trench formation.

Fourthly, a threshold voltage shift is taken place due to excessive formation of the plurality of moats M making the depth of the plurality of moats M deeper. The above threshold voltage shift results in a critical defect in product efficiency.

SUMMARY OF THE INVENTION

It is, therefore, an object of the present invention to provide a method for fabricating a semiconductor device capable of preventing a depth of a plurality of moats M from getting deeper as preventing lowering a threshold voltage by forming a round shape of a top corner of a trench.

In accordance with one aspect of the present invention, there is provided a method for fabricating a semiconductor device, including the steps of: forming a pad pattern by sequentially stacking a pad oxide layer and a pad nitride layer on a substrate; forming a trench by etching process to an exposed surface of the substrate by using the pad pattern as a mask; filling an insulation layer for isolating device elements filled into the trench; removing the pad nitride layer; performing a pre-cleaning process for removing the pad oxide layer; selectively recessing the surface of the substrate to remove a plurality of moats M taken place after removing the pad oxide layer; and forming a screen oxide layer on the surface of the substrate.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device having a trench-shaped layer for isolating device elements in accordance with a preferred embodiment of the present invention will be described in detail with reference to the accompanying drawings.

FIGS. 2A to 2H are cross-sectional views illustrating a method for fabricating a semiconductor device having a trench shaped layer for isolating device elements in accordance with a preferred embodiment of the present invention.

Figure 1A:
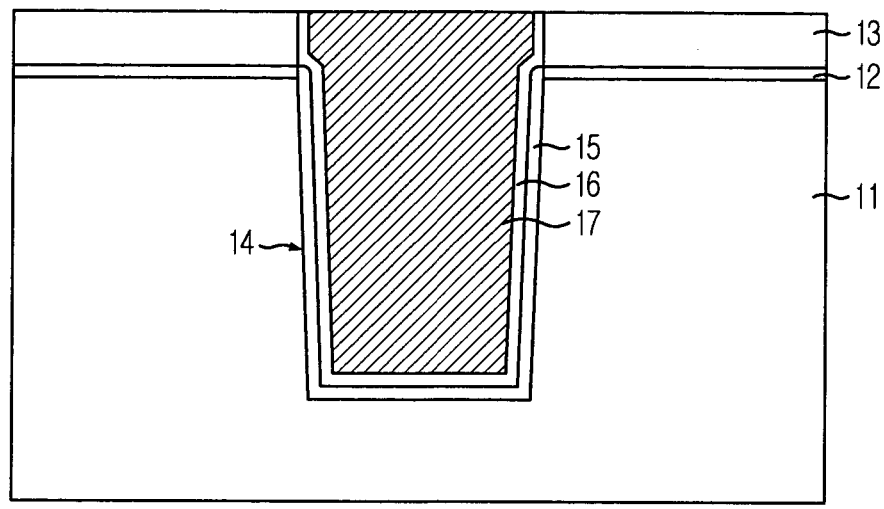
FIGS. 1A to 1D are cross-section views illustrating a method for isolating device elements with use of a conventional shallow trench isolation (STI).
Figure 1B:
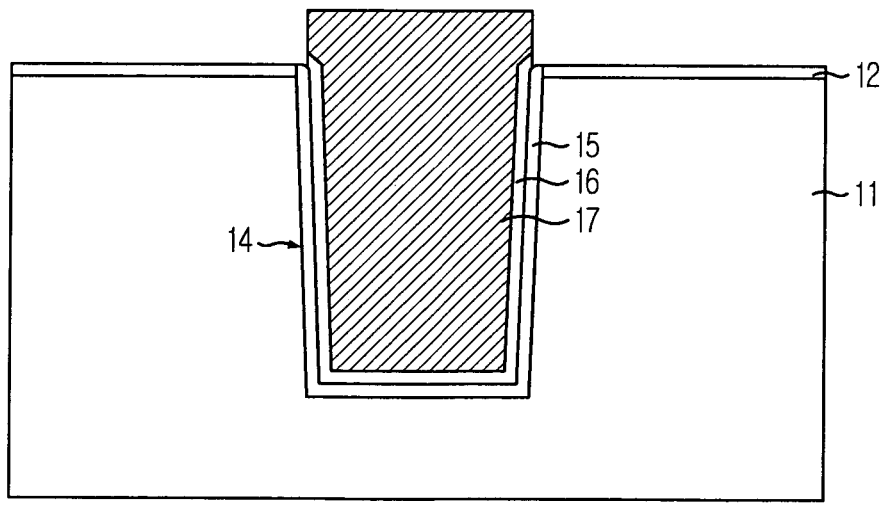
Figure 1C:
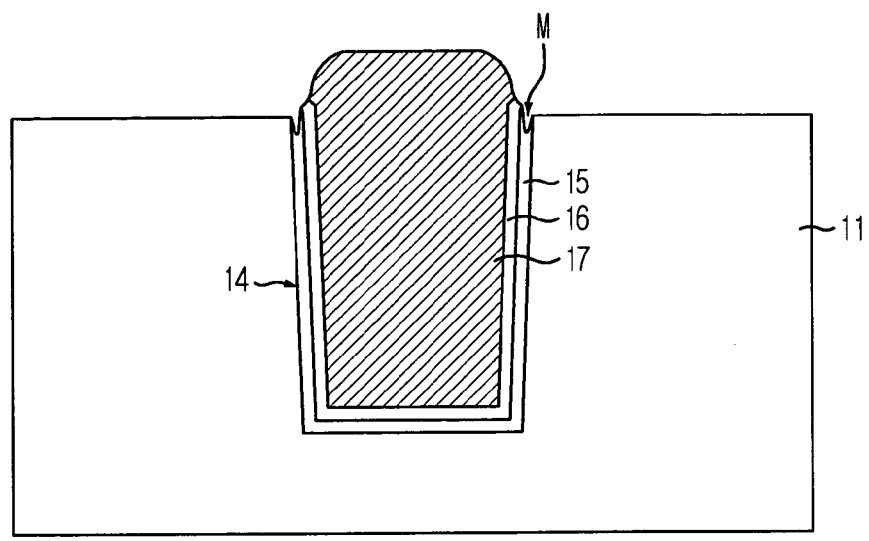
Figure 1D:
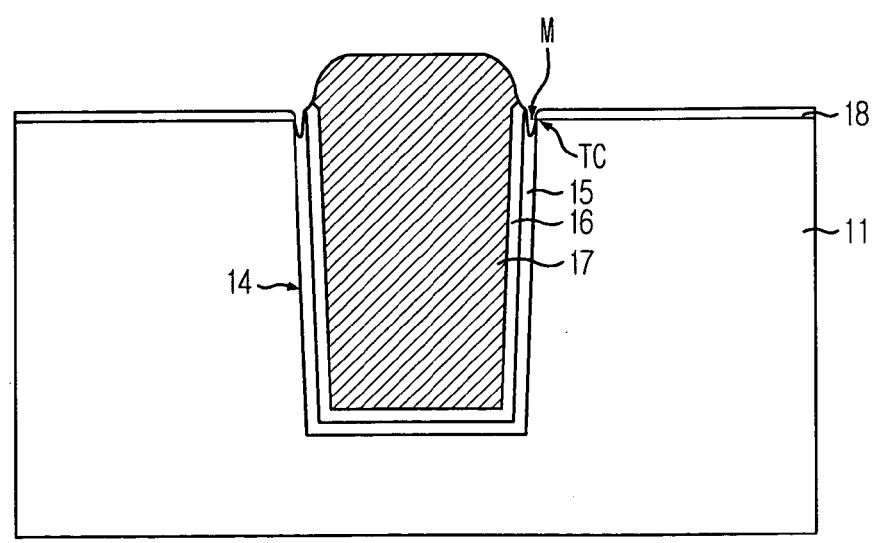
Figure 2A:
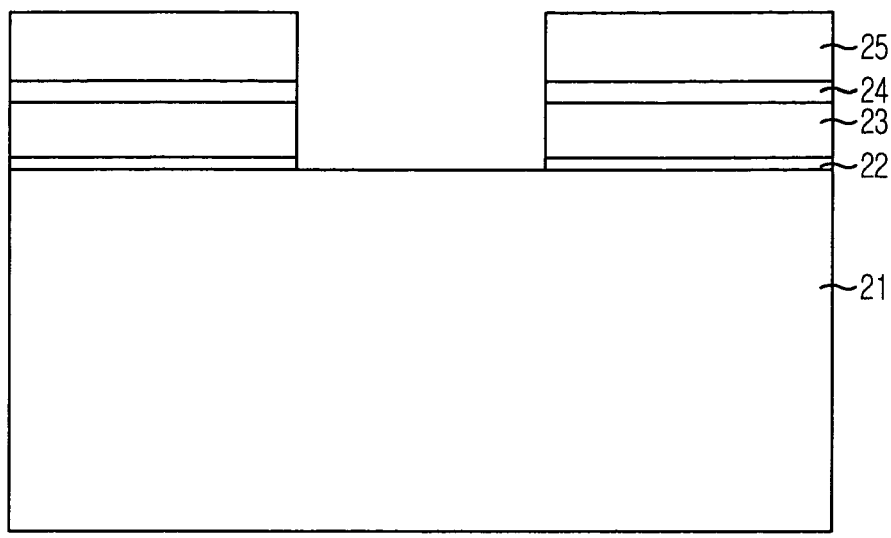
FIGS. 2A to 2H are cross-sectional views illustrating a method for fabricating a semiconductor device having a trench-shaped layer for isolating device elements in accordance with a preferred embodiment of the present invention.

Referring to FIG. 2A, a pad oxide layer 22 and a pad nitride layer 23 are sequentially formed on a silicon substrate 21. Herein, the pad nitride layer 23 serves a role of an etch barrier layer later and a polishing stop layer during a subsequent chemical mechanical polishing (CMP) process. Preferably, the pad oxide layer 22 should be a silicon oxide ($SiO_2$) layer with a thickness ranging from 50 Å to 300 Å and the pad nitride layer 23 should be a silicon nitride ($Si_3N_4$) layer with a thickness ranging from 300 Å to 1000 Å.

Next, an anti-reflection layer 24 is formed on the pad nitride layer 23. Herein, the anti-reflection layer 24 being made up of the silicon nitride ($Si_3N_4$) layer is used for an easy performance of a subsequent photolithography process.

Next, a photoresist layer is formed on the anti-reflection layer 24. Then, a photoresist layer pattern 25 defining a device elements isolation region by patterning with use of a photo-exposure process and a developing process is formed. Afterwards, the anti-reflection layer 24, the pad nitride layer 23 and the pad oxide layer 22 are sequentially etched back with use of the photoresist layer pattern 25 as an etch mask. The above etching processes are proceeded in a pad nitride etching equipment with steps of etching the anti-reflection layer; etching the pad nitride layer; and excessively etching the pad nitride layer.

First, a step of etching the anti-reflection layer with use of the photoresist pattern 25 as the etch mask uses a mixed gas, i.e., mixing trifluoromethane ($CHF_3$), tetrafluoromethane ($CF_4$), argon (Ar) and oxygen ($O_2$), and determines an etch stop point with an end of point (EOP), i.e., a point that discontinues the etching process. For instance, if a process recipe is closely examined, $CHF_3$ ranging from approximately 10 sccm to approximately 30 sccm, $CF_4$ ranging from approximately 20 sccm to approximately 30 sccm, $O_2$ ranging from approximately 5 sccm to 20 sccm, or a mixed gas of the above etching gases is used as an etch gas. When using the mixed gas, $CF_4$ has the most infinite amount of the mixed gas.

Next, the exposed pad nitride layer 23 after etching back the anti-reflection layer 24 is subjected to the etching process. The same etch gases used for etching back the anti-reflection layer 24 is also used for this etching process. For instance, if a process recipe is closely examined, $CHF_3$ ranging from approximately 5 sccm to approximately 30 sccm, $CF_4$ ranging from approximately 5 sccm to approximately 15 sccm, $O_2$ ranging from approximately 0 sccm to approximately 10 sccm, or a mixed gas of the above etching gases is used as an etch gas. When using the mixed gas, $CHF_3$ has the most infinite amount of the mixed gas. When etching back the pad nitride layer 23, the pad oxide layer 22 beneath the pad nitride layer 23 is also etched back.

Next, the excessive etching process of the pad nitride layer 23 is proceeded. The excessive etching process is for removing a defect such as a silicon spot produced on the silicon substrate 21 after etching back the pad nitride layer 23 and the pad oxide layer 22. The excessive etching process uses a mixed gas of $CF_4$, Ar and $O_2$.

Figure 2B:
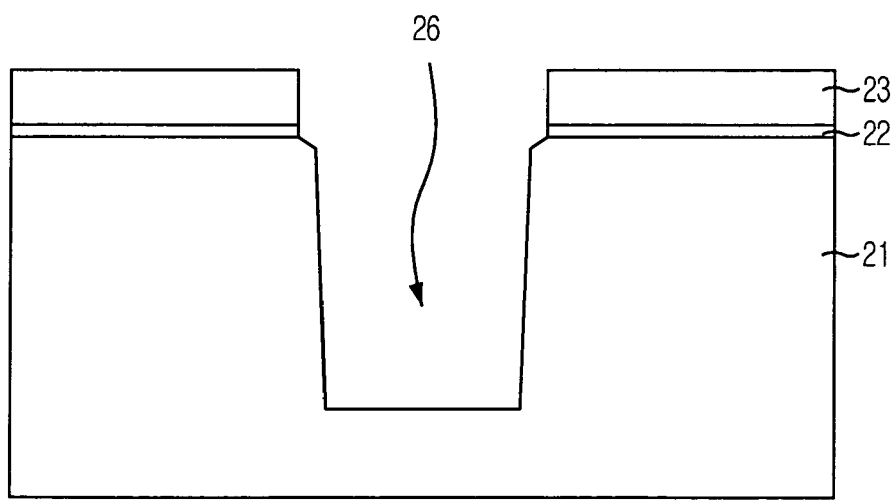

Referring to FIG. 2B, as illustrated in the above, the pad nitride layer 23 is subjected to the etching process and then, the photoresist layer pattern 25 and the anti-reflection layer 24 are applied to a stripping process. At this time, the striping process is performed with use of oxygen plasma.

Next, the silicon substrate 21 is etched back with use of the pad nitride layer 23 as the etch mask, thereby forming a trench 26. A process forming the trench 26 by etching the silicon substrate 21 is consisted of four steps. The first step is to control a round angle of top corners of the trench 26 by etching back a surface of the silicon substrate with use of hydrogen bromide (HBr). The second step is to remove a natural oxide layer. The third step is to perform the etching back process to the silicon substrate 21 as much as determined. The last step is to remove a gas used in the third step. The above steps are proceeded in the silicon etching equipment.

As for the first step, the etching process is performed with use of the etch gas including a gas having HBr of 40 sccm or the above etching process can be proceeded by adding helium (He). As for the second step, the etching process is proceeded with use of a mixed gas of $CF_4$ and He. The third step is a main etching process forming the trench 26. In this step, the etching process is performed with use of a mixed gas of hydrogen bromide (HBr) and chlorine ($Cl_2$). For instance, the etching process of the third step is performed with use of a mixed gas, i.e., mixing HBr, $Cl_2$, $O_2$, and He. Lastly, the etching process of the fourth step uses a mixed gas, i.e., mixing $CF_4$, $O_2$, Ar and He, to remove a chlorine gas of a chamber atmosphere during the third step.

As illustrated in the above, the top corners of the trench 26 have round angles ranging from 45° to 90° after the etching process is applied to form the trench 26.

Figure 2C:
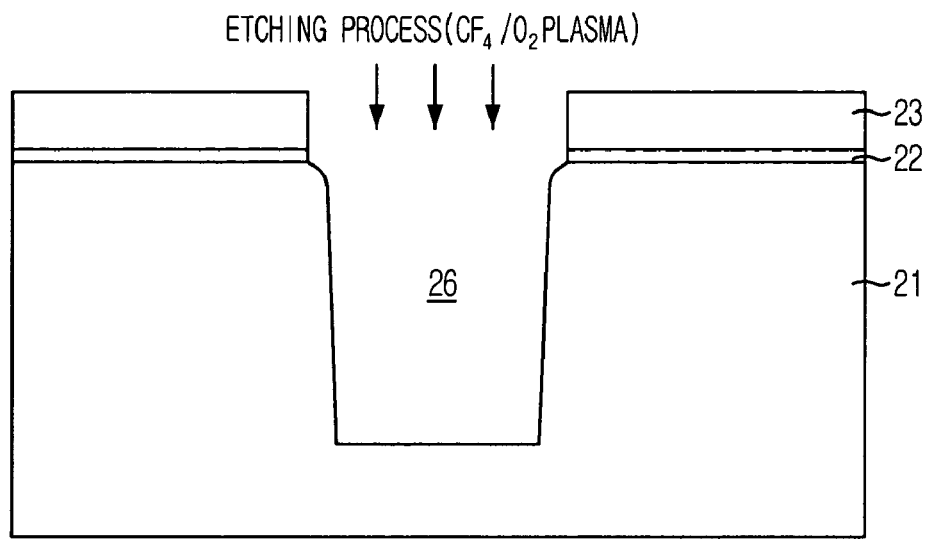

Next, referring to FIG. 2C, the etching process additionally etching the trench 26 is proceeded. For instance, a LET (light etch treatment), $CF_4/O_2$ plasma treatment or $O_2/N_2$ plasma is proceeded. At this time, a microwave down stream plasma method is commonly applied to the above etching process. After the above etching process, the angles of the top corners will be ranged from 55° to 85°.

As an etch damage layer produced while etching the trench 26 is removed and the rounding angles of the top corners are limited to ranges from 55° to 85° through the above etching process. For instance, the etching process applied with the microwave down stream plasma method has a property of more etching the top corners which is more salient relative to the sidewall of the trench 26 close to a right angle. Therefore, the etching process applied with the microwave down stream plasma method can make the top corners after formation of the trench 26 more round.

The $CF_4/O_2$ plasma treatment or $O_2/N_2$ plasma treatment applied for the etching process additionally etching the trench 26 can control the round angles of the top corners of the trench 26 identically. However, the $CF_4/O_2$ plasma treatment reduces a width of the reacted regions compared to the $O_2/N_2$ plasma treatment. For instance, in case of that the etching process additionally etching the trench 26 is performed with use of the $CF_4/O_2$ plasma treatment, the width of the reacted region ranges from 1100 Å to 1200 Å. However, in case of that the etching process additionally etching the trench is performed with use of the $O_2/N_2$ plasma treatment, the width of the reacted region range is more than 1200 Å.

Figure 2D:
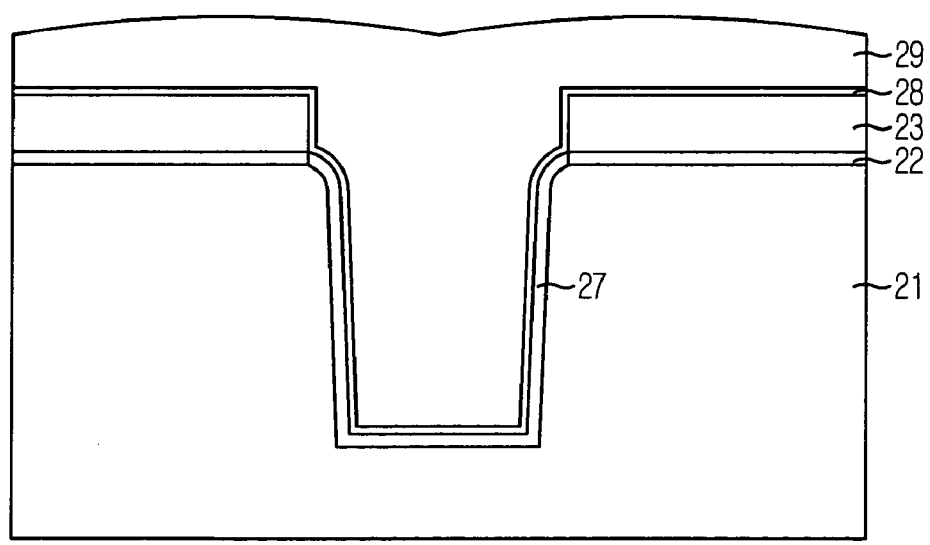

Referring to FIG. 2D, a wall oxide layer 27 is formed with a thickness ranging from 60 Å to 120 Å on the sidewall of the trench 26 through performing the wall oxidation process. At this time, the wall oxidation process is proceeded through a dry oxidation at a temperature ranging form 900° C. to 1000° C. The dry oxidation more oxidizes the top corners compared to a wet oxidation, thereby forming more round top corners.

Next, a liner nitride layer 28 is deposited in the sidewall of the trench 26. Until filling in the trench 26 with the liner nitride layer 28, a gap-fill insulation layer of high density plasma is deposited.

Figure 2E:
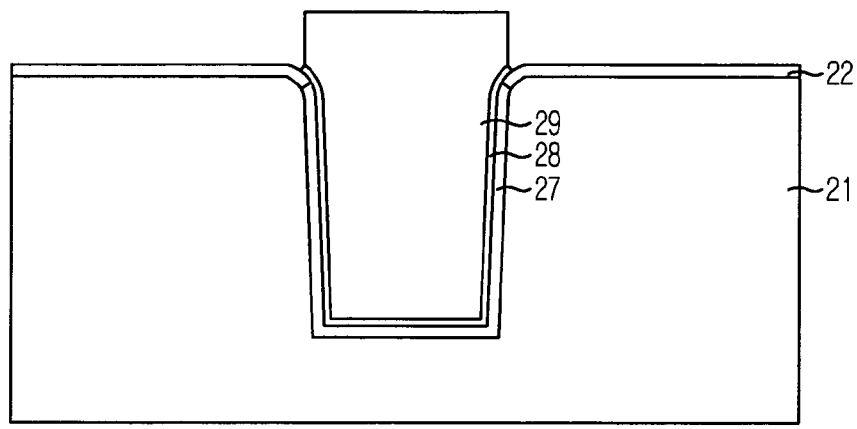

Referring to FIG. 2E, the gap-fill insulation layer is planarized until a surface of the pad nitride layer 23 is exposed through the CMP.

Subsequently, the pad nitride layer 23 is removed with use of a wet solution such as a phosphate ($H_3PO_4$). At this time, the pad oxide layer 23 and the wall oxide layer 27 have an etch selective ratio towards the phosphate. Therefore, the pad oxide layer 23 and the wall oxide layer 27 are not etched back. However, the liner nitride layer 28 which is a nitride-based layer is partially etched back.

Figure 2F:
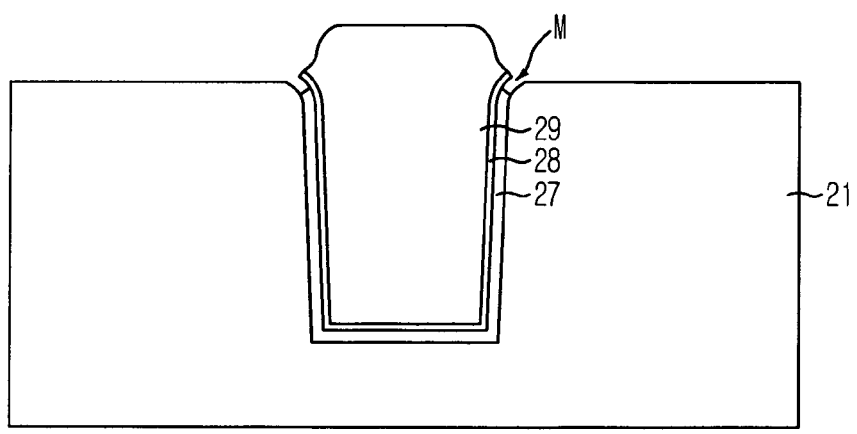

Referring to FIG. 2F, the pre-cleaning process is proceeded for removing the pad oxide layer 22 before implanting the threshold voltage ions. At this time, the pad oxide layer 22 is removed with use of the HF solution diluted with water in a ratio of approximately 50 to 300 parts of water to approximately 1 part of the HF to expose the surface of the substrate except for the trench 26.

The plurality of moats M are still produced after removing the pad oxide layer 22. The present invention uses the wet etching process subjected to the substrate exposed after removing the pad oxide layer 22 to remove the plurality of moats M.

Figure 2G:
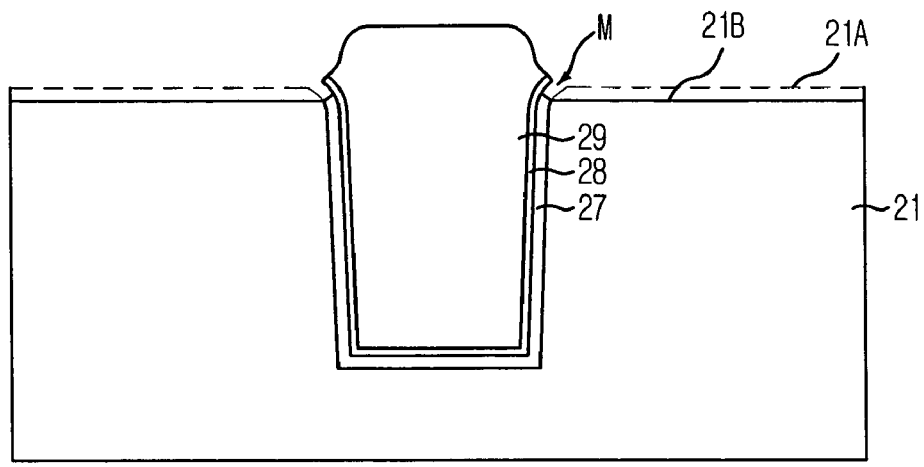

Referring to FIG. 2G, the surface of the substrate 21 with the plurality of moats M is selectively recessed, thereby forming the surface of the substrate 21 without the plurality of moats M. Reference numeral 21A and 21B denote the surface of the substrate with and without the plurality of moats M, respectively.

The recessing process applied to the above substrate 21 proceeds with use of the wet etching process. At this time, the wet etching process uses an etch solution that selectively etches back only silicon composing the substrate 21 instead of etching back the liner nitride layer 28, the gap-fill insulation layer 29 and the wall oxide layer 27.

For instance, the substrate 21 is dipped into a bath containing the hot solution of standard clean (SC)-1 solution, i.e., a mixed solution of ammonium hydroxide ($NH_4OH$), hydrogen peroxide ($H_2O_2$), and water ($H_2O$) in a preferable ratio of 1 to 5 to 50. At this time, a temperature of the SC-1 solution should be from 25° C. to 100° C. and a dipping time should be 3 minutes to 20 minutes.

As illustrated in the above, the present invention uses the wet etching process using the SC-1 solution when the recessing process for removing the plurality of moats. However, the dry etching process can be used to remove the plurality of moats M. In case of using the dry etching process, a degree of uniformity is decreased and an additional process for removing a damage on the substrate caused by the plasma is required.

Furthermore, the present invention makes the surface of the substrate smooth without any flexure after applying the wet etching process.

Figure 2H:
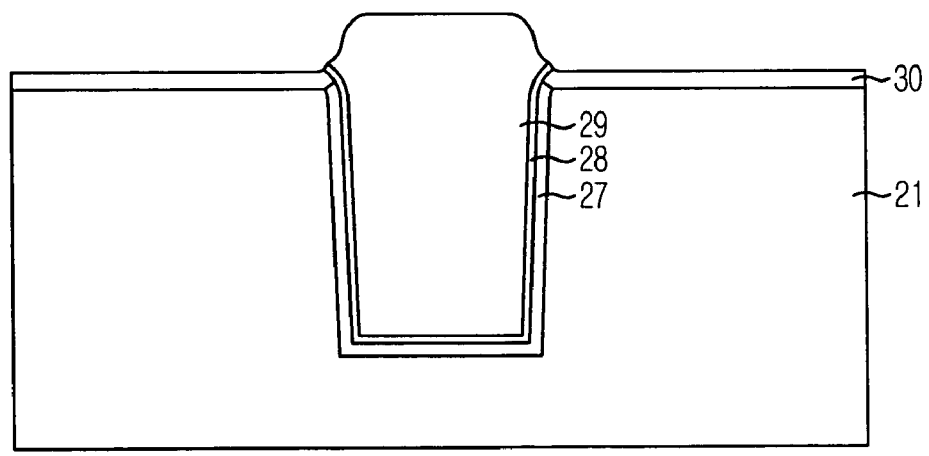

Referring to FIG. 2H, the screen oxide layer 30 is formed with a thickness ranging from 50 Å to 70 Å at a temperature ranging from 750° C. to 1100° C. through the dry oxidation process. Afterwards, impurities for controlling the threshold voltage is ion implanted.

As a following process, the screen oxide layer 30 is removed, the pre-cleaning process before the gate oxide layer process and the gate oxide layer process are employed. At this time, because the depth of the plurality of the moats M is already low the depth of the plurality of the moats M is prevented from getting deeper when forming the gate oxide layer.

On the other hand, the gate oxide layer is formed with a temperature ranging from 850° C. to 1000° C. through the dry oxidation process similar to a formation of the screen oxide layer 30. If the screen oxide layer 30 and the gate oxide layer are formed through the dry oxidation process, the top corners of the trench become more round.

As illustrated in the above, in case of employing the etching process for forming the gate electrodes after depositing the polysilicon layer on the gate oxide layer under a condition of forming the plurality of moats is minimized, remaining the undesirable polysilicon layer on the plurality of moats M is prevented.

Table 2 shows a depth of the plurality of moats based on each step of the process of the present invention.

TABLE 2

| ISO Etch | Trench Top Corner | 90° | 90° |
|---|---|---|---|
| | $CF_4/O_2$ | No | Yes |
| | $O_2/N_2$ | Yes | No |
| Wall Oxidation | Pre-Cleaning | 30" | 30" |
| | Layer Thickness | 80 Å | 80 Å |
| Screen Oxidation | Pre-Cleaning | 50:1 HF | 50:1 HF |
| | Layer Thickness | 50 Å | 50 Å |
| Gate oxidation | Pre-Cleaning | HF 50" | HF 50" |
| | Layer Thickness | 100 Å | 100 Å |
| Moat | Depth | 68 Å | 69 Å |

According to Table 2, 'ISO Etch' means a pad nitride layer etching process and a trench etching process. 'LET' and '$O_2/N_2$' mean an after-etching process additionally etching the trench.

During the trench etching process, an angle of the top corner TC should be 90° and then, the above etching process is performed. During the gate oxidation process, the pre-cleaning process is proceeded for 50 seconds with use of a hydrogen fluoride (HF), resulting in a formation of the gate oxide layer with a thickness of 100 Å.

During the screen oxidation process, the pre-cleaning process is proceeded for 250 seconds with use of the HF solution diluted with water in a ratio of 99 parts of water to 1 part of the HF and is subsequently proceeded for 10 minutes with use of the hot SC-1 solution. Then the screen oxide layer is formed with a thickness of 50 Å. In this case, the depth of the plurality of moats M is approximately 68 Å which is much thinner than that of the conventional method. The reason why the depth of the plurality of moats M of the present invention is much thinner because the plurality of moats M are removed by recessing the silicon substrate with use of the hot SC-1 solution during the pre-cleaning process performed before the formation of the screen oxide layer.

Although not shown in Table 2, during the wall oxidation process, the pre-cleaning process is employed for 75 seconds and during the screen oxidation process, the pre-cleaning process is proceeded for 250 seconds with use of the HF solution diluted with water in a ratio of 99 parts of water to 1 part of the HF and is subsequently proceeded for 10 minutes with use of the hot SC-1 solution. In this case, the depth of the plurality of moats M are measured 36 Å which is very thin.

In accordance with the present invention, if the screen oxidation process is performed with use of mixture of the HF and the hot SC-1 solution and a running time of the pre-cleaning process is appropriately adjusted, the depth of the plurality of the moats M can be thin with a thickness ranging from 30 Å to 70 Å.

In accordance with the present invention, a point which the plurality of the moats M begins to form after the pre-cleaning process before forming the screen oxide layer has a plus value. However, in accordance with the conventional method, a point which the plurality of the moats begins to form after the pre-cleaning process before forming the screen oxide layer has a minus value. Therefore, it is not avoidable having a thick plurality of the moats M.

As a result, the present invention prevents the plurality of moats M from getting thicker when forming the screen oxide layer by recessing the silicon substrate after removing the pad oxide layer.

Based on the preferred embodiment of the present invention, it is possible to prevent lowering the threshold voltages of the transistor by making the top corners of the trench round by performing the after-etching process after etching the trench.

Furthermore, the present invention makes it possible to improve the use of the semiconductor device by lowering the depth of the plurality of the moats M less than 100 Å by performing the recessing process for removing the plurality of the moats M after removing the pad oxide layer.

The present application contains subject matter related to the Korean patent application No. KR 2004-0032773, filed in the Korean Patent Office on May, 10, 2004 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabrication of a semiconductor device, comprising the steps of:
    forming a pad pattern by sequentially stacking a pad oxide layer and a pad nitride layer on a substrate;
    forming a trench by etching process to an exposed surface of the substrate by using the pad pattern as a mask;
    filling an insulation layer for isolating device elements filled into the trench;
    removing the pad nitride layer;
    performing a pre-cleaning process for removing the pad oxide layer;
    selectively recessing the surface of the substrate to remove a plurality of moats M taken place after removing the pad oxide layer;
    forming a screen oxide layer on the surface of the substrate; and
    implanting ions for controlling threshold voltage into the substrate using the screen oxide layer as a mask.

2. The method of claim 1, wherein the recessing process is performed with use of a hot solution of standard clean (SC)-1 solution.

3. The method of claim 1, wherein the recessing process with use of the hot SC-1 solution is performed by mixing ammonium hydroxide ($NH_4OH$), hydrogen peroxide ($H_2O_2$), and water ($H_2O$) in a preferable ratio of 1 to 5 to 50 at a temperature ranging from 25° C. to 100° C. for 3 minutes to 20 minutes.

4. The method of claim 1, wherein the pre-cleaning process is proceeded with use of a HF solution diluted with water in a ratio of approximately 50 to 500 parts of water to approximately 1 part of the HF.

5. The method of claim 1, wherein the step of forming the screen oxide layer is proceeded with use of the dry etching process.

6. A method for fabrication of a semiconductor device, comprising the steps of:
   forming the pad pattern by sequentially stacking the pad oxide layer and a pad nitride layer on the substrate;
   forming a trench by etching the exposed surface of the substrate with use of the pad pattern as a barrier;
   etching top corners (TC) of the trench round;
   forming a wall oxide layer on sidewalls and a bottom of the trench;
   forming a gap-fill insulation layer on the wall oxide layer of the trench;
   removing the pad nitride layer;
   performing a cleaning process to remove the pad oxide layer;
   selectively recessing a surface of the substrate to remove the plurality of moats M produced after removing the pad oxide layer;
   forming a screen oxide layer on the recessed substrate;
   implanting ions for controlling a threshold voltage into the substrate using the screen oxide layer as a mask;
   removing the screen oxide layer; and
   forming the gate oxide layer on the above resulting substrate.

7. The method of claim 6, wherein the recessing process is performed with use of a hot solution of standard clean (SC)-1 solution.

8. The method of claim 6, wherein the recessing process with use of the hot SC-1 solution is performed by mixing ammonium hydroxide ($NH_4OH$), hydrogen peroxide ($H_2O_2$), and water ($H_2O$) in a preferable ratio of 1 to 5 to 50 at a temperature ranging from 25° C. to 100° C. for 3 minutes to 20 minutes.

9. The method of claim 6, wherein the pre-cleaning process is proceeded with use of the HF solution diluted in a ratio of 50 parts of the HF to 1 of water and 300 parts of the HF to 1 part of water.

10. The method of claim 6, wherein each step of forming the wall oxide layer, the screen oxide layer and the gate oxide layer is proceeded with use of the dry etching process.

11. The method of claim 10, wherein the wall oxide layer is formed with a thickness ranging from 60Å to 120Å at a temperature ranging from 900° C. to 1000° C.

12. The method of claim 10, wherein the screen oxide layer is formed with a thickness ranging from 50Å to 70Å at a temperature ranging from 750° C. to 1100° C.

13. The method of claim 10, wherein the gate oxide layer is formed at a temperature ranging from 850° C. to 1000° C.

14. The method of claim 6, wherein the step of proceeding the etching process additionally etching the trench to make the top corners of the trench round is performed with use of the $CF_4/O_2$ plasma treatment.

15. A method for fabrication of a semiconductor device, comprising the steps of:
   forming a pad pattern by sequentially stacking a pad oxide layer and a pad nitride layer on a substrate;
   forming a trench by etching process to an exposed surface of the substrate by using the pad pattern as a mask, wherein said trench is formed by etching the top corners (TC) of the trench round, removing a natural oxide layer, and etching back to the substrate;
   filling an insulation layer for isolating device elements filled into the trench;
   removing the pad nitride layer;
   performing a pre-cleaning process for removing the pad oxide layer;
   selectively recessing the surface of the substrate to remove a plurality of moats M taken place after removing the pad oxide layer;
   forming a screen oxide layer on the surface of the substrate; and
   implanting ions for controlling a threshold voltage into the substrate using the screen oxide layer as a mask.

* * * * *